United States Patent [19]
Sines et al.

[11] Patent Number: 6,071,756
[45] Date of Patent: Jun. 6, 2000

[54] METHOD FOR HOLDING COMPONENTS IN PLACE DURING SOLDERING

[75] Inventors: John Colin Sines, Binghamton, N.Y.; David Reed Benedict, Susquehanna, Pa.

[73] Assignee: Lockheed Martin Corporation, Johnson City, N.Y.

[21] Appl. No.: 09/137,466

[22] Filed: Aug. 20, 1998

[51] Int. Cl.[7] .......................... H01L 21/44; H01L 21/48; H01L 21/50; H01L 23/48; H05K 1/18

[52] U.S. Cl. .................. 438/107; 438/117; 257/697; 257/727; 361/760; 361/769

[58] Field of Search ..................... 438/107, 117, 438/612; 257/697, 698, 727; 361/743, 769, 760

[56] References Cited

U.S. PATENT DOCUMENTS

| | | | |
|---|---|---|---|
| 4,953,061 | 8/1990 | Nitkiewicz | 361/417 |
| 4,982,376 | 1/1991 | Megens | 361/400 |
| 5,045,976 | 9/1991 | Guilleminot | 361/417 |
| 5,046,243 | 9/1991 | Walker | 29/878 |
| 5,642,266 | 6/1997 | McCartney | 361/809 |
| 5,754,407 | 5/1998 | Kohno | 361/760 |
| 5,777,852 | 7/1998 | Bell | 361/769 |

*Primary Examiner*—Charles Bowers
*Assistant Examiner*—Nema Berezny
*Attorney, Agent, or Firm*—W. H. Meise; G. H. Krauss

[57] ABSTRACT

A method for fabricating a printed-circuit board includes the steps of loading components onto the printed circuit board, and placing a pin array over the components. Each pin is free to move "downward," and each component has at least one pin pressing on it to hold the component in place. Each component also preferably has a pin on each side of it, to hold it against lateral movement. The pin support arrangement is dimensioned so that a gap or space exists between the support and the component side of the board. Heat is applied to the gap, and flows through the interstices between the pins to heat the solder on the upper side of the board to fuse the solder and make the desired connections.

6 Claims, 7 Drawing Sheets

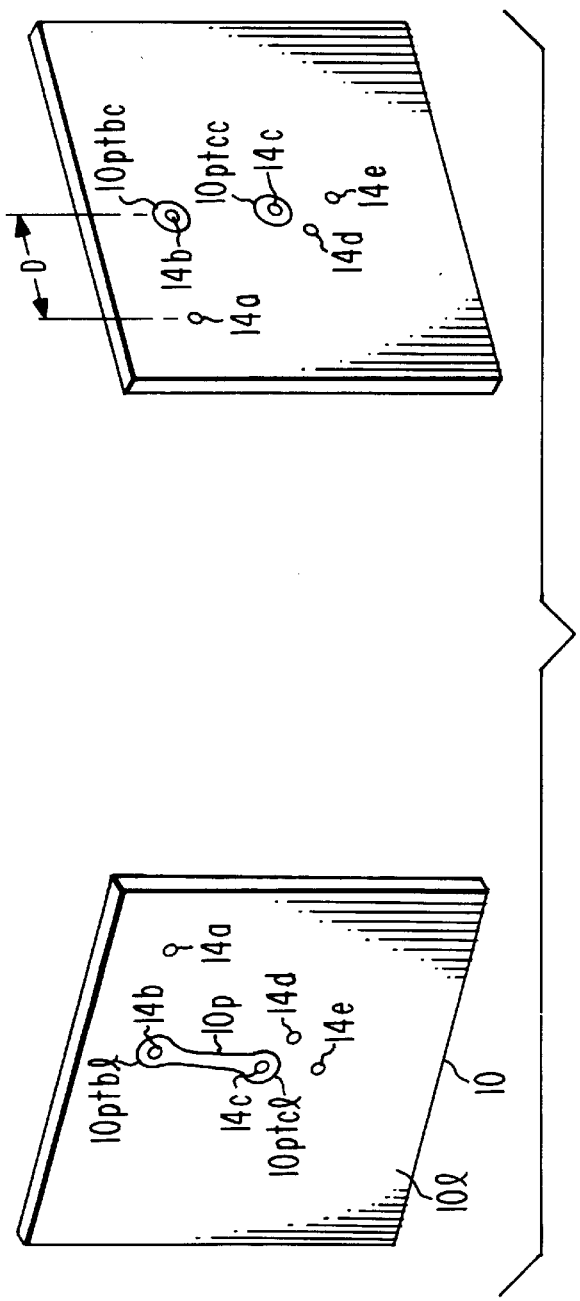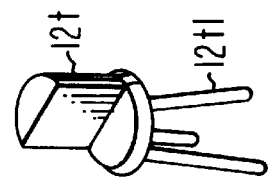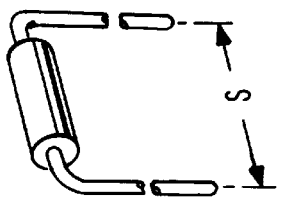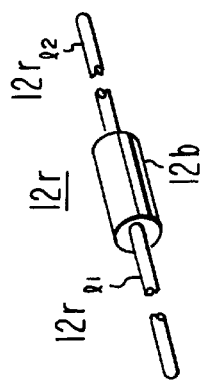

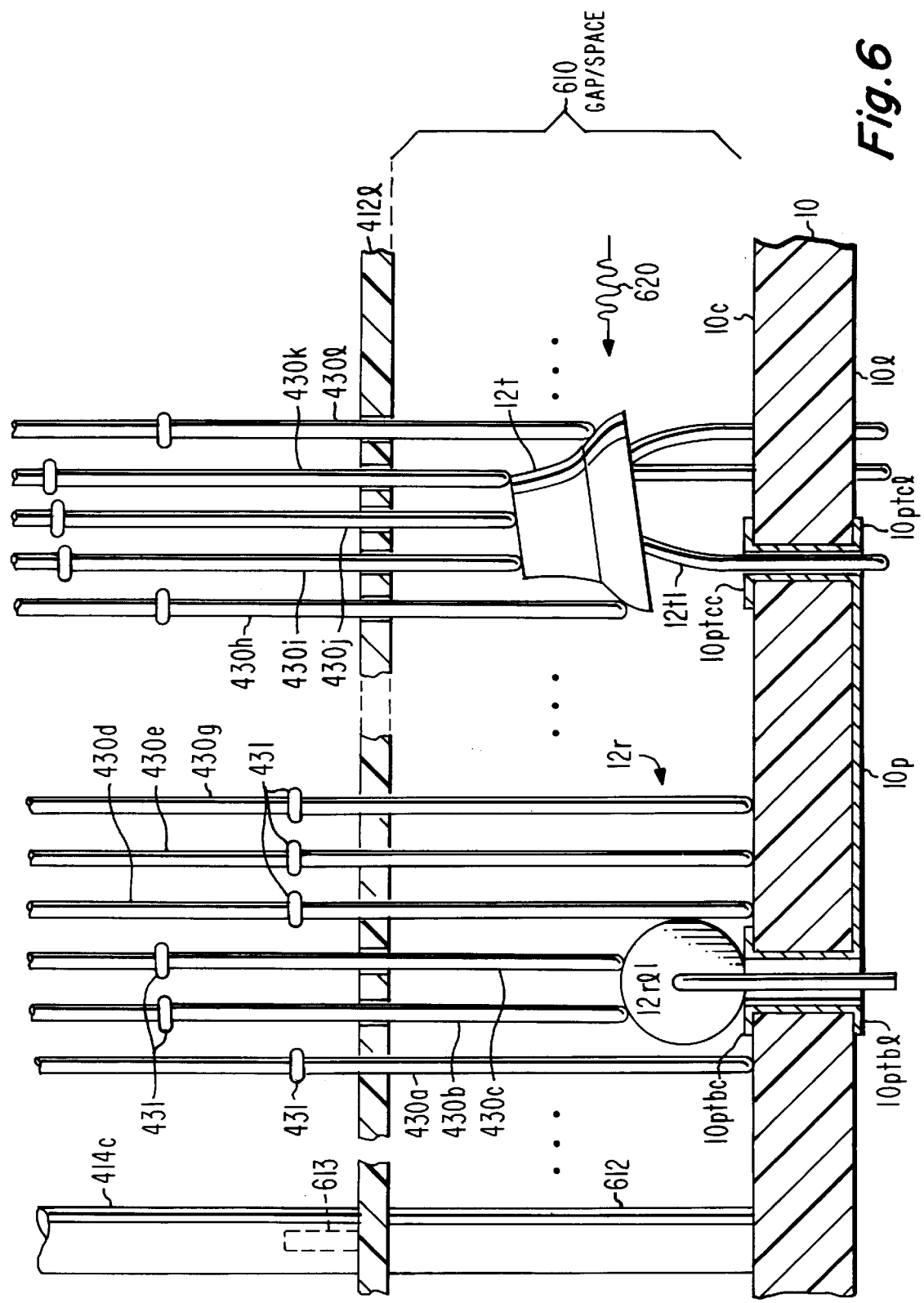

METHOD FOR HOLDING COMPONENTS IN PLACE DURING SOLDERING

FIELD OF THE INVENTION

This invention relates to fabrication of printed-circuit assemblies, and more particularly to methods for holding components in place during soldering or brazing of the leads to terminals of the printed-circuit board.

BACKGROUND OF THE INVENTION

The fabrication of printed-circuit board assemblies is now highly automated. The printed-circuit boards are pre-drilled for the component leads, and automatic insertion of the component leads ("stuffing" the board) is commonplace. In order to keep the components from falling out of the printed-circuit board after the component leads are inserted, if soldering is not performed immediately after the lead insertion, the leads may be clinched by bending over that portion of the leads protruding from the opposite side of the printed-circuit board. The lead clinching operation is often combined with the component lead insertion step. After the lead clinching, or in conjunction therewith, the excess lead length is cut off. After the clinching/cutting step, the printed-circuit board, now loaded with components, may be ready for soldering or fusion of the leads to terminals of the printed-circuit board. The terminals are often co-located with the lead-accepting holes.

The soldering of leads was performed in the past by applying soldering paste or other oxidation control material to the underside of the board, and passing the loaded printed-circuit board through a solder wave. The solder wave heated the leads and the terminals, and if the gap therebetween was small, left an adherent mass of molten solder, which quickly cooled and solidified when outside the solder wave, to form the desired fused connection. The solder wave provides a great time and cost advantage over individual soldering of each terminal to each lead.

Soldering of leads to their terminals by the use of solder waves is subject to a number of disadvantages. One disadvantage is the environmental effect of large amounts of molten lead-containing solder. Another disadvantage is the difficulty of maintaining an even solder wave, which does not extend too high or too low at any position along the width of the printed-circuit board being soldered; this problem is exacerbated by the presence of dross, which is nonsoluble material which tends to float on the solder, and arises for the most part due to oxidation of flux materials. A major disadvantage of the solder-wave technique is that the high density of the solder wave tends to cause the components to float on the wave, and results in components which are soldered in positions which are not anticipated, high above the surface of the component side of the printed-circuit board. The clinching operation is intended as much to prevent the components from floating completely out of the board, which might result in closing the lead-accepting hole or aperture with solder, without the lead being in the hole, which would require rework to re-melt the solder in that particular hole, and insertion of the component at the same time. Such rework is expensive, but what is worse, the reworked solder joint is less reliable than one which is virgin.

As a result of the disadvantages of the solder-wave soldering technique, the solder reflow soldering method has become common. In the solder reflow method, the lead side of the printed-circuit board is coated with solder paste, which includes flux-type material. The printed-circuit board is then "stuffed" with components, and the leads are clinched, if necessary, and cut to length. The stuffed printed-circuit board, or at least the portion to be soldered, is then placed in a high-temperature environment long enough to cause the solder to "reflow" and make the fused joint. The board is then removed from the heated environment, or the heated environment is removed from the board, and the fused joints solidify to complete the soldering operation. The reflow soldering method has major advantages in control of the amount and location of the solder, in environmental problems, and in the problem of improperly oriented or located components due to floating.

Improved methods for placement of components in printed circuit boards in conjunction with soldering or fusion joining are desired.

SUMMARY OF THE INVENTION

A method according to an aspect of the invention, for soldering components onto a printed-circuit board, includes the step of inserting the leads of the components through apertures extending through the printed-circuit board, to thereby form or generate a loaded printed-circuit board. The loaded printed-circuit board is placed in a horizontal position, thereby defining an upper or component side of the loaded printed-circuit board. A pin array is placed over a region including at least some of the components on the horizontally oriented loaded printed-circuit board. The pin array includes a support arrangement extending over at least a portion of the region to be soldered, and also includes a horizontally disposed two-dimensional array of pins supported by the support arrangement. The horizontal spacing of the pins of the pin array is selected so that, when the pin array is registered with the loaded printed-circuit board, at least one of the pins is associated with or lies over a corresponding one of the components. The pins of the pin array are free to move over a predetermined distance toward the loaded printed-circuit board under the impetus of a force, which may be the force of gravity (the weight of the pins) or the force exerted by a spring, or both. The pins are restrained against motion over a distance exceeding the predetermined distance, to prevent them from falling out of the support arrangement during handling. The pin array is moved toward the loaded printed-circuit board, at least until the pins come into contact with the components. In a preferred method according to the invention, the pin array is moved toward the loaded printed-circuit board until those pins which do not contact an element come into contact with the component side of the printed-circuit board. The final step of the method is to perform the soldering, as by heating the region to be soldered to accomplish reflow.

According to a particular mode of the invention, the step of placing a pin array includes the step of placing a pin array in which the support arrangement is transparent, whereby the locations of the pins relative to the components is visible after the step of placing.

According to a further aspect of the invention, the step of placing a pin array includes the step of placing a pin array in which the spacing of the pins is regular in at least one horizontal direction.

Another manifestation of the invention is one in which the step of placing a pin array includes the step of placing a pin array in which the pins of the pin array are of length sufficient to hold the support arrangement spaced away from the components when the moving step is completed, thereby leaving a space, only partially occupied by the pins, between the components and the support arrangement. In this manifestation, the step of soldering the components includes the step of applying heat into the space, for reflow soldering of at least some of the leads of the components to terminals on the upper side of the board. This step of applying heat may be accomplished by radiant heating, or by passing heated fluid, such as air or some inert gas, across the surface to be heated. The surface to be heated may, of course, lie on the component side of the loaded printed circuit board.

BRIEF DESCRIPTION OF THE DRAWING

FIG. 1 represents a "God's eye" view of two sides of the same predrilled printed-circuit board;

FIGS. 2a and 2b are perspective or isometric views of a component or element which may be affixed to the printed-circuit board of FIGS. 1a and 1b, with the component leads in different configurations, and FIG. 2c is a perspective or isometric view of a single transistor carrier with its three leads;

FIG. 6 illustrates a further step of the method of FIG. 5, in which the pin array is lowered until the pin tips contact the surface of the printed-circuit board.

DESCRIPTION OF THE INVENTION

Figure 3:
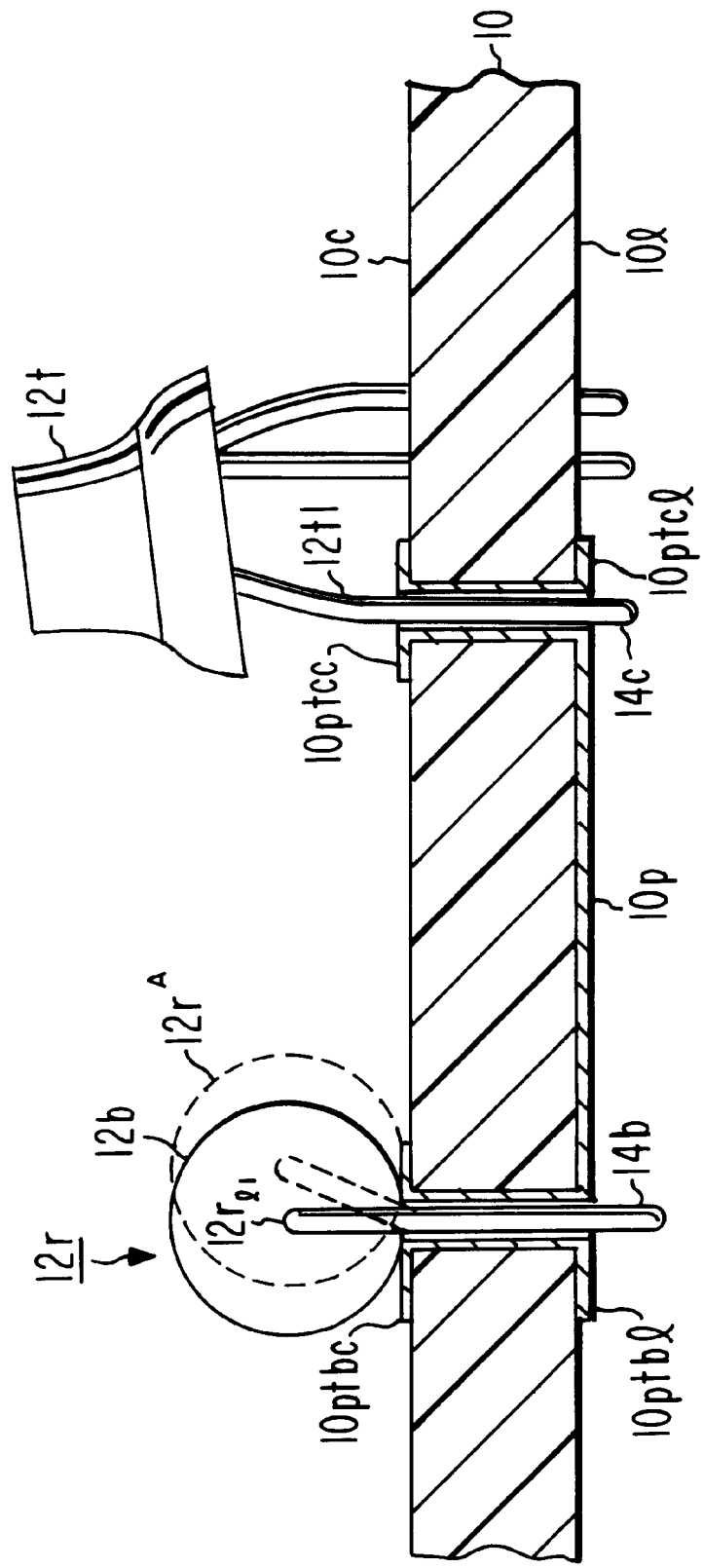
FIG. 3 is a simplified cross-sectional view of the printed-circuit board of FIG. 1, loaded with the components of FIGS. 2a, 2b, and 2c.

FIG. 1 illustrates two sides of a printed-circuit board (10). The printed-circuit board 10 defines an "upper" or obverse "component" side or surface 10c, and a "lower" or reverse side or surface 10l. FIGS. 1a and 1b illustrate some lead-accepting apertures or holes 14a, 14b, 14c, 14d, and 14e of a set 14 of apertures. Apertures or holes of set 14 are formed in the printed-circuit board in any conventional manner, as by drilling. It should be understood that very large numbers of such apertures actually occur in such printed circuit boards. The apertures of set 14 are placed at locations on the board which are selected to hold the components or elements of a set 12 of components, which are associated with the leads, in the desired positions, as described below. Those skilled in the art know that the printed-circuit board 10 is often printed (printing not illustrated), inter alia, with an outline representation of the element to be mounted on the printed-circuit board 10, as an additional assurance that the components are correctly placed.

The lower surface 10l of printed-circuit board 10 of FIG. 1 is printed with a pattern 10p of electrically conductive material, which is typically some form of metallic foil. As illustrated, pattern 10p extends a first terminal 10ptbl which is defined around aperture 14b on lower side 10l, and also extends to a second terminal 10ptcl. On the component side 10c of printed-circuit board 10, the printed pattern includes two circular regions, designated 10ptbc and 10ptcc, which are centered on the same apertures 14b, 14c as those on which lower-surface terminals 10ptbl and 10ptbl are centered. Thus, apertures 14b and 14c are surrounded by printed conductor material on both the upper or component side 10c and on the lower side 10l. Further, at least apertures 14b and 14c are plated-through with conductive "vias", meaning that a layer of electrically conductive material has been applied to inside surfaces of the apertures 14b and 14c, in electrical contact with the surrounding terminals. Thus, an electrically conductive "printed" path extends from the terminal 10ptcc on the upper or component side of printed-circuit board 10, through aperture 14c to terminal 10ptcl on the lower side of the printed-circuit board 10, then through printed conductive path 10p to terminal 10ptbl, then through the conductive path extending through aperture 14b, to terminal 10ptbc on the upper or component side 10c of printed-circuit board 10. Naturally, many of the other apertures will also be associated with terminal conductors, interconnection conductors, and plated-through vias, as is well known to those skilled in the art.

In FIG. 1, the subset of apertures 14a, 14b is intended to accept a component or element in the form of a resistor 12r, illustrated in perspective or isometric view in FIG. 2a with its leads $12r_{11}$ and $12r_{12}$ straight, as received from the supplier, and illustrated in FIG. 2b with its leads $12r_{11}$ and $12r_{12}$ bent into position for insertion into apertures 14a and 14b. Similarly, the subset of apertures 14c, 14d, and 14e is intended to accept a component or element in the form of a discrete transistor 12t, illustrated in perspective or isometric view in FIG. 2c with its leads $12t_{11}$ and $12t_{12}$ somewhat splayed. Again, it should be emphasized that the two components or elements which are illustrated in FIG. 2a, 2b, and 2c are a small subset of a vast number of different types of components which may be used in a printed-circuit assembly or in a loaded printed-circuit board. At the current state of the art, many, or possibly most, of the elements or components will be in the form of integrated-circuit carriers, each having tens, or even hundreds, of leads.

The leads $12r_{11}$ and $12r_{12}$ of resistor 12r of FIGS. 2a and 2b extend from the ends of a right-circular-cylindrical body 12b. As illustrated in FIG. 2b, the leads $12r_{11}$ and $12r_{12}$ are bent, at right angles to the axis (not illustrated) of the body 12b, to project radially. The spacing S between the leads $12r_{11}$ and $12r_{12}$ is selected to be equal to the spacing D between the apertures 14a and 14b on printed-circuit board 10. As a result, the leads $12r_{11}$ and $12r_{12}$ of component 12r can be inserted into apertures 14a and 14b, and the body 12b of component 12r can lie against upper or component surface 10c of printed-circuit board 10, as illustrated in cross-section in FIG. 3. It will be appreciated that the diameters of the plated-through apertures must be dimensioned to easily pass the leads of the associated components, to prevent binding or breakage during machine insertion of the components, and to prevent the scraping of conductive plating material from the insides of the plated-through apertures.

FIG. 3 is a cross-section of the printed circuit board 10 of FIG. 1, loaded with the resistor 12r and transistor 12t of FIGS. 2b and 2c, respectively. In FIG. 3, lead $12r_{11}$ of resistor 12r is seen to extend through aperture 14b, and the walls of aperture 14b are plated with conductive material. The body 12b of resistor 12r lies against the upper or component side 10c of board 10. Similarly, a lead 12t1 of transistor 12t extends through plated-through aperture 14c. In FIG. 3, the illustrated positions of the components may not be stable, because the leads of the components provide little lateral support in the oversize plated-through apertures. Consequently, any components capable of toppling out of position must be supported in the correct position. FIG. 3 illustrates by phantom lines designated $12r^A$ a possible alternative position of resistor 12r.

Figure 4A:
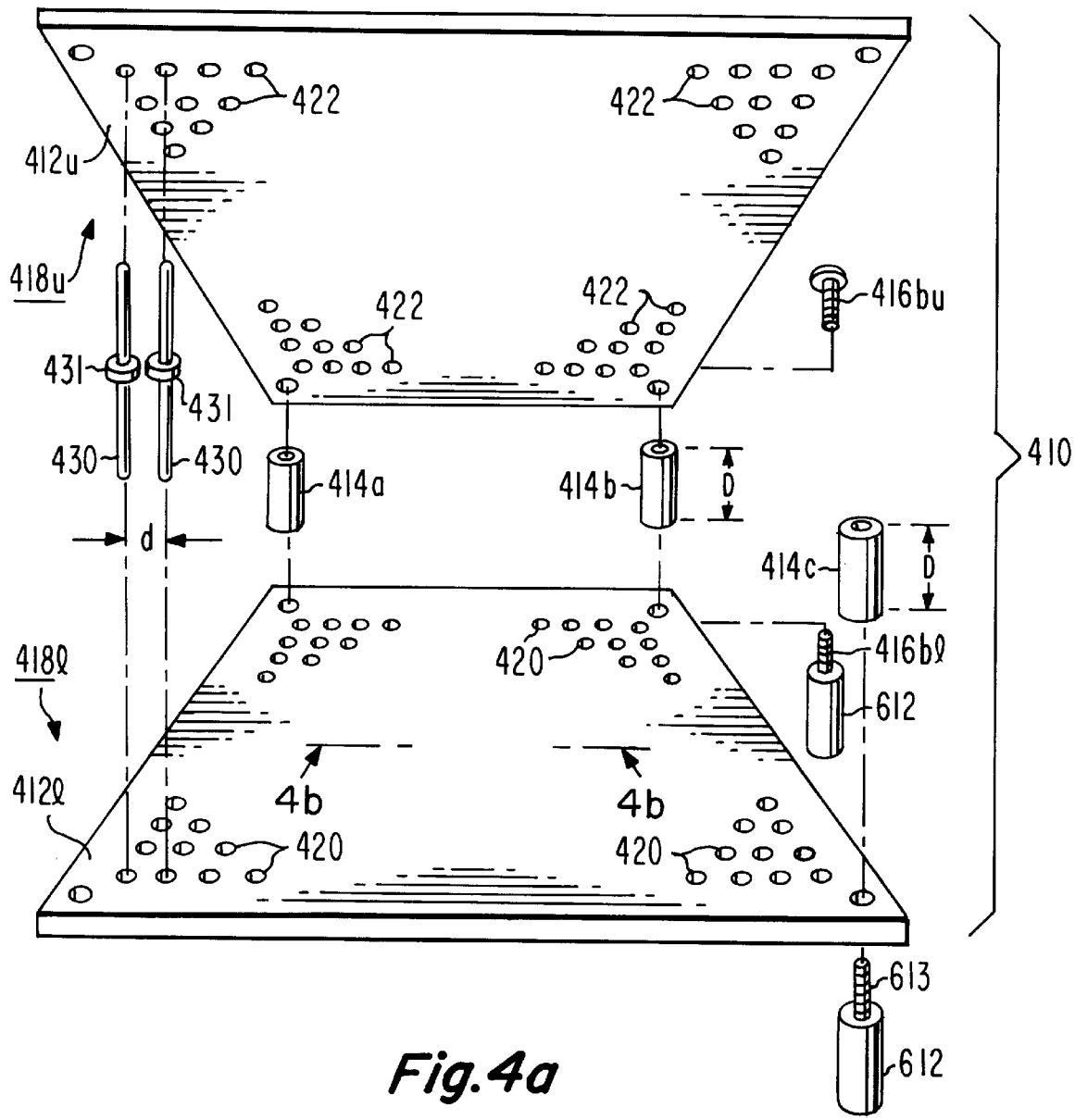
FIG. 4a is an exploded perspective or isometric view of a pin array which is used in a mode of the method according to the invention.
Figure 4B:
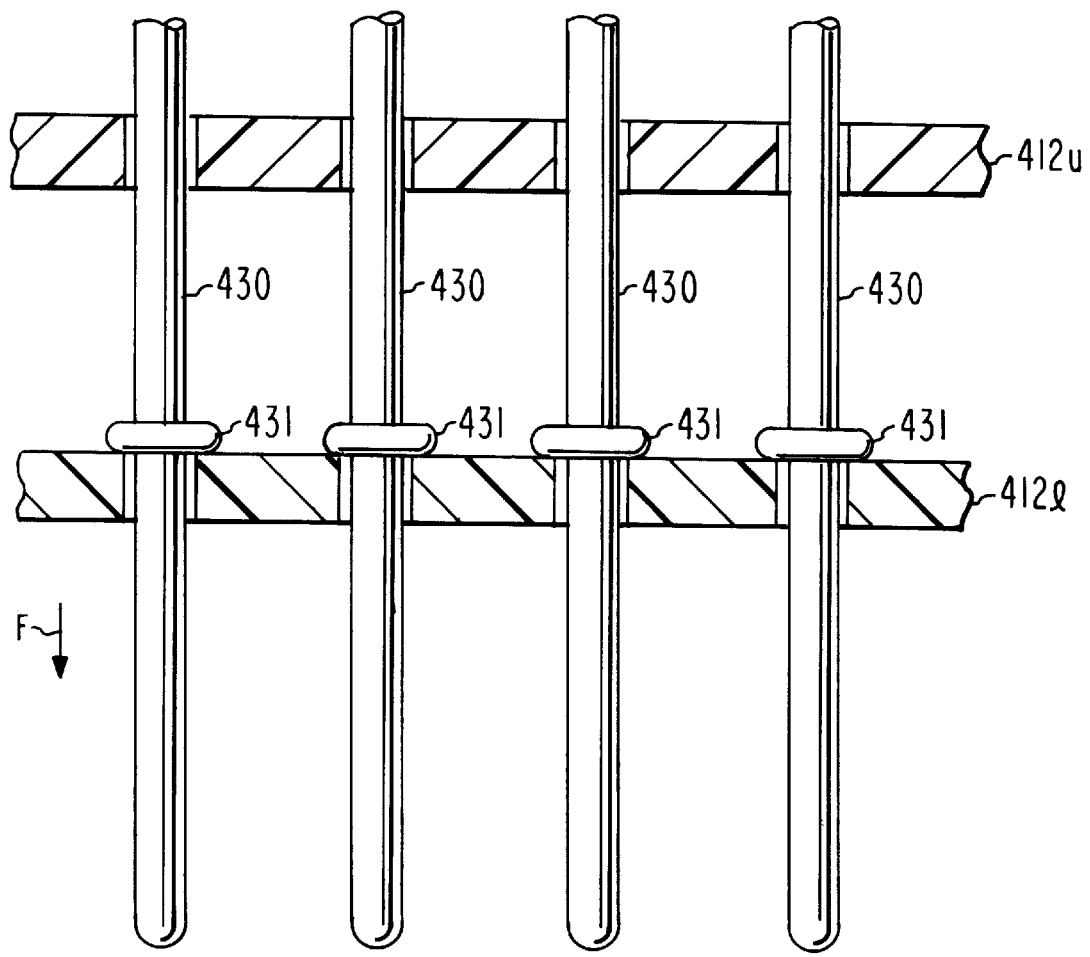
FIG. 4b is a cross-section of a portion thereof in the assembled state.
Figure 4C:
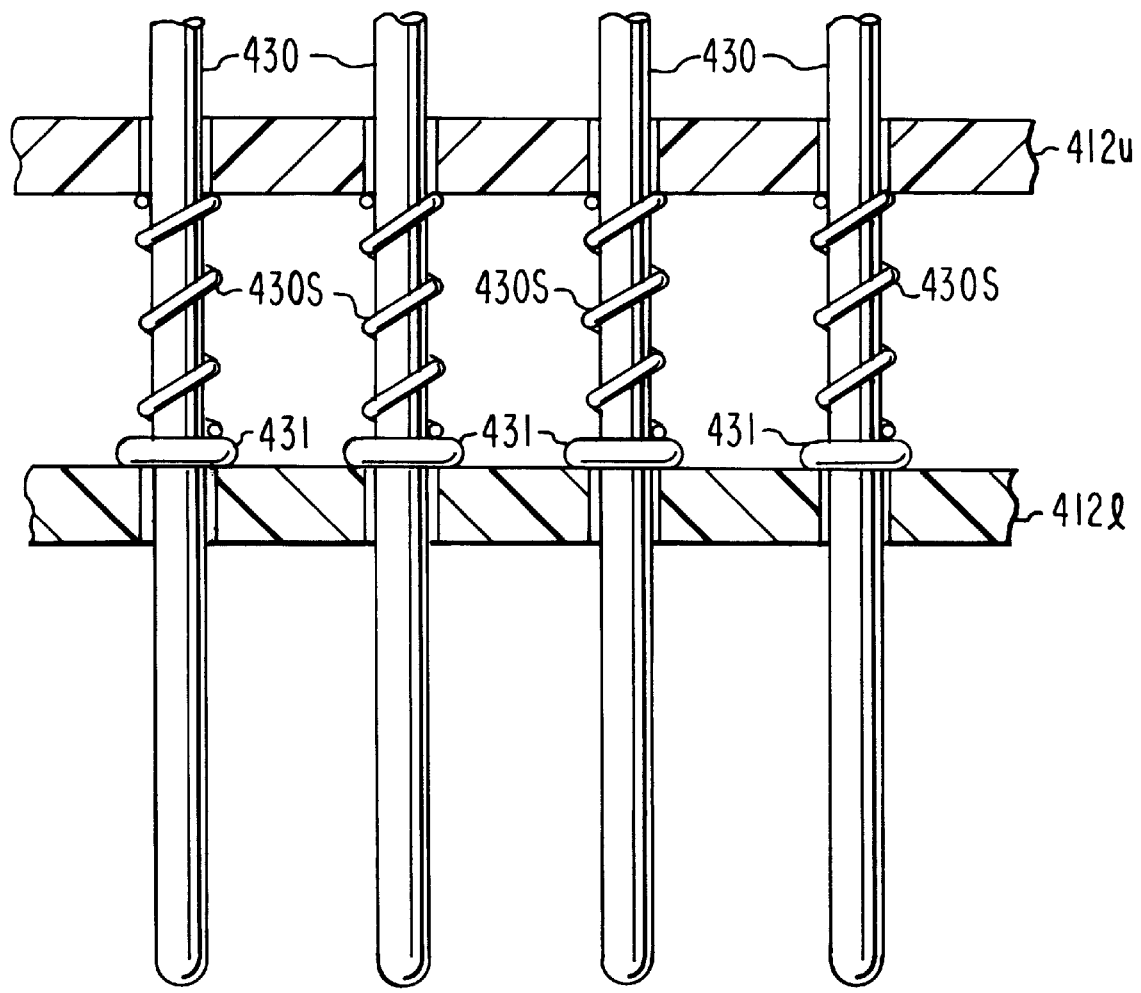
FIG. 4c is a cross-section similar to FIG. 4b, with additional pin force provided by springs.

FIGS. 4a and 4b illustrate a pin array 410 which is used in one mode of practice of the invention. In the exploded view of FIG. 4a, the pin array 410 includes a planar upper or top plate 412u and a planar lower plate 412l. Top plate 412u and lower plate 412l are held in a spaced-apart, mutually parallel relation by a set 414 including a plurality of interplate standoffs, some of which are illustrated as 414a, 414b, and 414c, which are located at the corners of the structure, and possibly by other such interplate standoffs (not illustrated) at interior locations. The interplate standoffs 414 include axial threaded apertures, and are held in position by screws passing through the upper and lower plates into the threaded apertures, as illustrated for interplate standoff 414b by screws 416bu and 416bl. As illustrated in FIG. 4a, lower screw 416bl is affixed to the upper end of a lower standoff 612, for purposes described below. Upper plate 412u and lower plate 412l each contain an array 418u and 418l, respectively, of mutually registered apertures, with a regular spacing of dimension d in at least one direction, and preferably in both directions. More particularly, array 418u includes a plurality of apertures 422 arrayed over the plate 412u, and array 418l includes a plurality of apertures 420 arrayed over plate 412l. The apertures of arrays 412u and 412l are mutually registered, so that each aperture 422 directly overlies an aperture 420. As illustrated in FIGS. 4a, 4b, and 4c, the pin array 410 includes a set 429 of a plurality of pins 430. Each pin 430 extends through an aperture 422 in the upper plate 412u and the corresponding aperture 420 in lower plate 412l. The pins 430 are dimensioned to slide freely in the apertures through which they extend, and are captivated or prevented from falling completely out of the supporting plates by a flange 431 associated with each pin 430, which is larger than the aperture through which the pin extends.

FIG. 4b illustrates a cross-section of the pin array 410 of FIG. 4a in its assembled form. As illustrated in FIG. 4b, the pins 430 are all held in their lowermost position, with their flanges 431 against the upper surface of lower plate 412l, by the force of gravity F acting on the pins. The section of FIG. 4c is similar, except that the force of gravity is augmented by the force of a coil spring 430s associated with each pin 430, located and compressed between the lower surface of the upper plate 412u and the pin's flange 431.

Figure 5:
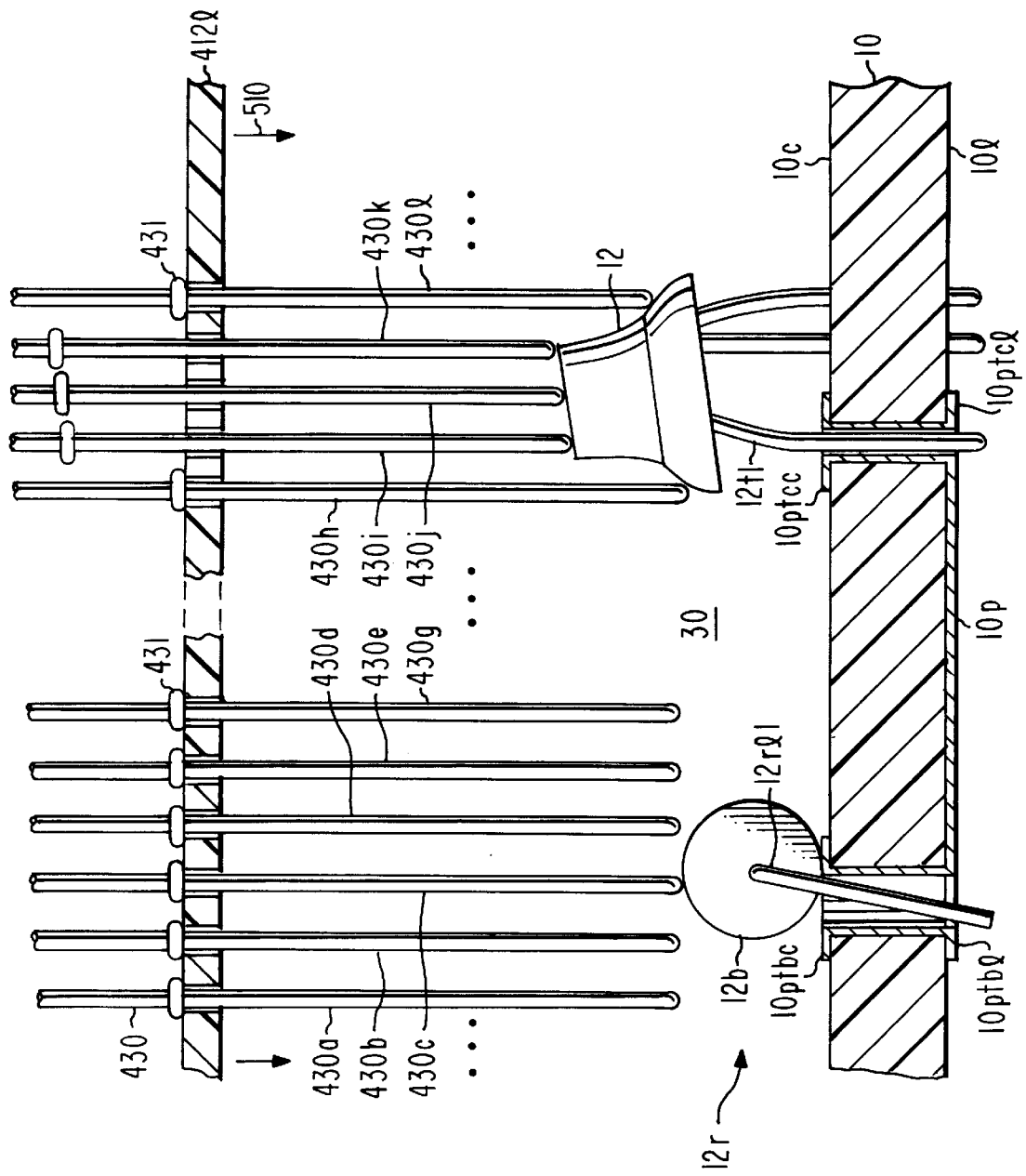
FIG. 5 illustrates a step of a method according to an aspect of the invention, in which a pin array as in FIGS. 4a, 4b, or 4c is lowered, to bring the pin tips into contact with some components.

FIG. 5 is a simplified cross-sectional view of a pin array 410 in accordance with FIG. 4a as it is brought into contact with the upper portion of components in the component-loaded printed-circuit board. Each pin 430 in FIG. 5 is identified separately by an alphabetic suffix, for ready identification. In FIG. 5, the printed-circuit board 10 with components 12r and 12t loaded thereon is identical to that of FIG. 3. More particularly, pin array 410 is held over a region 30 in which components such as 12r, 12t are located, and is in the process of being lowered, in the direction of arrow 510. In the illustrated state, pins 430a, 430b, 430c, 430d, 430e, and 430g are all hanging from lower plate 412l by their flanges 431, although the lower end or tip of pin 430d is touching the upper edge of body 12b of resistor 12r. Pins 430h and 430l are also hanging by their flanges 431, but are touching the flared sides of transistor 12t. The lower ends of pins 430i, 430j, and 430k are in contact with the upper portion of transistor 12t, and their weight helps to hold transistor 12t close to the upper surface 10c of printed-circuit board 10.

FIG. 6 is similar to FIG. 5, but with the pin array all the way down, with some of the pins in contact with the upper surface 10c of the printed-circuit board 10. In FIG. 6, the lower support plate 412l is lower than in FIG. 5. Pins 430h, 430i, 430j, 430k, and 430l, however, have not moved downward any more than in FIG. 5, because they are supported by transistor 12t. Pins 430a, 430e, and 430g, however, are all the way down against the upper surface 10c of the printed-circuit board. Pins 430b and 430c are pressing against the upper portion of the body of resistor 12r. Comparison of FIGS. 5 and 6 shows that, while pin 430d was pressing against an upper edge of the tilted body of resistor 12r, its weight (or the weight of the pin plus the force of the spring if the embodiment is of a spring-loaded pin) has pushed the body of resistor 12r to the left, in essence standing the resistor upright, and its continued presence on one side of the resistor body prevents the resistor from again toppling over. One can easily understand that, when many such pins are provided on a small incremental array dimension, each component may have many pins tending to push it down into intimate contact with the upper surface 10c of the printed-circuit board 10, and many pins tending to prevent it from lateral movement or toppling.

The pin array 410 may be held in the proper position above the upper surface 10c of the printed-circuit board 10 by a plurality of lower standoffs, one of which is illustrated as 612 in FIG. 6.

After the components of FIGS. 3, 5, and 6 are held in place by the pin array, as illustrated in FIG. 6, a gap or space 610 exists between the lower support plate 412l of the pin array and the upper surface 10c of the printed-circuit board, and this gap, while it contains pins 430, also has myriad void regions in and about the pins. Heat can be applied to the bottom surface 101 of the printed-circuit board to fuse the solder paste previously screened or printed thereon, and heat can similarly be applied to the gap or space 610, as suggested by photon symbol 620, to assure that the solder paste on the upper surface 10c of the printed-circuit board also fuses. The heat may be applied to the gap in the form of heated gas, such as air or nitrogen, or possibly by means of heat radiation, as from a reflective electrical heater, or both.

In a method according to the invention, the pin array was a 6-by-9 inch array with transparent Lexan support plates and an array of six hundred pins in a regular array.

Other embodiments of the invention will be apparent to those skilled in the art. For example, while the printed-circuit board of FIGS. 1, 5, and 6 has been described as having printed conductors on upper and lower surfaces, many modern printed-circuit boards are multi-layer boards, which have printed conductors on intermediate layers, connected together and to the outer layers by conductive vias. While the apertures of sets 412u and 412l on the plates of the pin array have been indicated as being registered, there may be some apertures which are not registered, or which have no corresponding apertures on the other plate. While each component has been described as having one or more pins pressing on it, some components may not need such pressing, as for example components which are held in place by screws or other holders, and the pin array may contain gaps in the region in which pins are not wanted or needed. On the other hand, a general-purpose pin array will likely be larger than many boards with which it may be used, and may have pins in regions in which there are no components to be pressed in place. A pin array made especially for one, or a small number of different printed-circuit boards, may have a shape adapted to the shape of the boards, or the largest of them, and a pin layout which covers only some of the components.

Thus, a method for fabricating a printed-circuit board generally includes the steps of loading components onto the printed circuit board, and placing a pin array over the components. Each pin is free to move downward, where "downward" means toward the component side of the loaded printed circuit board, and each component has at least one pin pressing on it to hold the component in place. Each component also preferably has a pin on each side of it, to hold it against lateral movement. The pin support arrangement is dimensioned so that a gap or space exists between the support and the component side of the board. Heat is applied to the gap, and flows through the interstices between the pins to heat the solder on the upper side of the board to fuse the solder and make the desired connections.

More particularly, a method according to an aspect of the invention, for soldering components or elements (12) onto a printed-circuit board (10), includes the step of inserting the leads (12*l*) of the components (12) through apertures (14) extending through the printed-circuit board (10), to thereby form or generate a loaded printed-circuit board (10). The loaded printed-circuit board (10) is placed in a horizontal position, thereby defining an upper or component side (10*c*) of the loaded printed-circuit board (10). A pin array (410) is placed over a region (30) including at least some of the components (12) on the horizontally oriented loaded printed-circuit board (10). The pin array (410) includes a support arrangement (412*u*, 412*l*) extending over at least a portion of the region (30) to be soldered, and also includes a horizontally disposed two-dimensional array (34) of pins (36) supported by the support arrangement (412*u*, 412*l*). The horizontal spacing of the pins (430) of the pin array (410) is selected so that, when the pin array (410) is registered with the loaded printed-circuit board (10), at least one of the pins (430) is associated with or lies over a corresponding one of the components (12). The pins (430) of the pin array (410) are individually free to move over a predetermined distance (D) toward the loaded printed-circuit board (10) under the impetus of a force (F), which may be the force (F) of gravity (the weight of the pins) or the force (F) exerted by a spring, or both. The pins (430) are restrained (by flanges 431 and the support plates 412*u*, 412*l*) against motion over a distance exceeding the predetermined distance (D), to prevent them from falling out of the support arrangement (412*u*, 412*l*) during handling. The pin array (410) is moved toward the loaded printed-circuit board (10), at least until the pins (430) come into contact with the components (12). In a preferred method according to the invention, the pin array (410) is moved toward the loaded printed-circuit board (10) until those pins (430*a*, 430*e*, 430*g* of FIG. 6) which do not contact an element (12) come into contact with the component side (10*c*) of the printed-circuit board (10). The final step of the method is to perform the soldering, as by heating (620) the region (610) to be soldered to accomplish reflow.

According to a particular mode of the invention, the step of placing a pin array (410) includes the step of placing a pin array (410) in which the support arrangement (412*u*, 412*l*) is transparent, whereby the locations of the pins (430) relative to the components (12) is visible after the step of placing.

According to a further aspect of the invention, the step of placing a pin array (410) includes the step of placing a pin array (410) in which the spacing (d) of the pins (430) is regular in at least one horizontal direction.

Another manifestation of the invention is one in which the step of placing a pin array (410) includes the step of placing a pin array (410) in which the pins (430) of the pin array (410) are of length sufficient allow the support arrangement (412*u*, 412*l*) to be spaced away from the components (12) when the moving step is completed, thereby leaving a space (610), only partially occupied by the pins (430), between the components or elements (12) and the support arrangement (412*u*, 412*l*). In this manifestation, the step of soldering the components (12) includes the step of applying heat into the space (610), for reflow soldering of at least some of the leads (12*l*) of the components (12) to terminals on the upper or component side (10*c*) of the board (10). This step of applying heat may be accomplished by radiant heating, or by passing heated fluid, such as air or some inert gas, across the surface to be heated. The surface to be heated may, of course, lie on the component side (10*c*) of the loaded printed circuit board (10).

What is claimed is:

1. A method for soldering components onto a printed-circuit board, comprising the steps of:

inserting the leads of said components through apertures extending through said printed-circuit board to thereby form a loaded printed-circuit board;

placing said loaded printed-circuit board in a horizontal position, thereby defining an upper side of said loaded printed-circuit board, and selecting said upper side as that side adjacent said components;

placing, over a region including at least some of said components on said horizontally oriented loaded printed-circuit board, a pin array, said pin array comprising a support arrangement extending over at least a portion of said region, said support arrangement supporting a horizontally disposed two-dimensional array of pins, the horizontal spacing of said pins being selected so that at least one of said pins lies over a corresponding one of said components, at least some of said pins being free to move, independent of motion of other ones of said pins, over a predetermined distance toward said loaded printed-circuit board under the impetus of a force, and being restrained against motion over a distance exceeding said predetermined distance;

moving said pin array toward said loaded printed-circuit board at least until said pins come into contact with said components; and soldering said components to said loaded printed-circuit board.

2. A method according to claim 1, wherein said step of placing a pin array includes the step of placing a pin array in which said support arrangement is transparent, whereby the locations of said pins relative to said components is visible after said step of placing.

3. A method according to claim 1, wherein said step of placing a pin array includes the step of placing a pin array in which said spacing of said pins is regular in at least one horizontal direction.

4. A method according to claim 1, wherein said step of placing a pin array includes the step of placing a pin array in which the weight of said pins provides at least a portion of said force.

5. A method according to claim 1, wherein said step of placing a pin array includes the step of placing a pin array in which each pin is associated with a spring arrangement which applies at least a portion of said force.

6. A method according to claim 1, wherein said step of placing a pin array includes the step of placing a pin array in which said pins of said pin array are of length sufficient so that said support arrangement is spaced away from said components when said moving step is completed, thereby leaving a space between said components and said support arrangement; and said step of soldering said components includes the step of applying heat into said space, for reflow soldering of at least some of said leads of said components to terminals on said upper side of said board.

* * * * *